United States Patent [19]
Webster, Jr. et al.

[11] Patent Number: 5,794,687
[45] Date of Patent: Aug. 18, 1998

[54] FORCED AIR COOLING APPARATUS FOR SEMICONDUCTOR CHIPS

[75] Inventors: Leo H. Webster, Jr., Cary, N.C.; Lawrence Shungwei Mok, Brewster, N.Y.; Vinod Kamath, Raleigh; Mohanlal S. Mansuria, Apex, both of N.C.

[73] Assignee: International Business Machine Corp.

[21] Appl. No.: 905,688

[22] Filed: Aug. 4, 1997

[51] Int. Cl.⁶ ............................................. H05K 7/20
[52] U.S. Cl. .................... 165/121; 165/80.3; 361/697; 415/90
[58] Field of Search ..................... 165/80.3, 121, 165/122; 361/697; 415/90

[56] References Cited

U.S. PATENT DOCUMENTS

| | | | |
|---|---|---|---|
| 5,000,254 | 3/1991 | Williams | 165/85 |
| 5,297,617 | 3/1994 | Herbert | 165/80.3 |
| 5,309,983 | 5/1994 | Bailey | 165/80.3 |
| 5,335,143 | 8/1994 | Maling, Jr. et al. | 361/694 |
| 5,419,679 | 5/1995 | Gaunt et al. | 415/90 |
| 5,445,215 | 8/1995 | Herbert | 165/80.3 |
| 5,566,749 | 10/1996 | Jordan et al. | 165/80.3 |
| 5,583,746 | 12/1996 | Wang | 361/697 |
| 5,597,034 | 1/1997 | Barker, III et al. | 165/80.3 |
| 5,629,834 | 5/1997 | Kodama et al. | 361/695 |

Primary Examiner—Allen J. Flanigan
Attorney, Agent, or Firm—George E. Grosser

[57] ABSTRACT

An integrated air mover/heatsink for cooling semiconductor chip packages supports disks to rotate within the heat sink parallel to a heat receiving surface so that the heat sink acts as an enclosing housing for the disks. The heat sink preferably defines enclosing aperatures for respective disks which are closely spaced and coextensive heat with transfer surfaces over which air is forced by rotation of the disks. By so arranging the disks and enclosing aperature walls parallel to the heat receiving surface, a forced intimate flow of air over heat sink surfaces is achieved in a low profile configuration. Alternative implementations provide cooling for multiple chips and various arrangements for intake and exhaust of cooling air.

10 Claims, 8 Drawing Sheets

FORCED AIR COOLING APPARATUS FOR SEMICONDUCTOR CHIPS

BACKGROUND OF THE INVENTION

1. Technical Field of the Invention

The present invention relates in general to cooling devices for electronic devices such as semiconductor chips and in particular to forced air cooling apparatus which are suited to operate in locations with limited clearance above the device to be cooled.

2. Description of the Related Art

The heat output of powerful high-performance semiconductor chips is often intense. To deal with this heat and prevent the chips from destroying themselves, it has become necessary to provide special external chip cooling. One known method of cooling is to provide a heat conducting plate in contact with the chip that has heat exchanger fins which extend to enhance convection cooling. This approach is generally effective but can prove inadequate, especially where space is tight so that air flow constrained. Special semiconductors have been used for cooling which transfer heat from one surface to another when energized so as to have a cool side and a hot side. The chip is arranged in contact with the cool side; but, at the hot side the heat again has to be dissipated to the air to permit the device to continue operation.

Miniature "muffin fans" with multibladed propellers also have been used on chips to pull air over the chip surface or the surface of an attached heat collector (e.g. see U.S. Pat. Nos. 5,297,617, 5,309,983 and EP572326-A2). U.S. Pat. No. 5,445,215 describes an impeller with blades or paddles or blades mounted on spokes and traveling in grooves that increase surface area. One embodiment is intended to cool semiconductors attached at a flange on the fan housing. Parallel rotating disks are described in U.S. Pat. No. 5,419,679, which are rotated to draw air through an opening in an attached chassis for cooling electronic devices located inside.

Disks are also described in U.S. Pat. No. 5,335,143 which rotate in fins of a heat exchanger to provide cooling for semiconductors. The arrangement is rather bulky, however, with only a small portion of a disk pumps air at any given time.

While the art does teach devices for cooling semiconductor chip devices, there remains a need for a compact, cooling device which, nonetheless, pumps air over a large heat exchange area to provide effective heat removal.

SUMMARY OF THE INVENTION

The present invention by arranging one or more thin disks to rotate and act as air movers in close fitting slots formed in a heat conducting housing achieves high heat transfer rates between the moving air and the slot walls of the housing. In a preferred implementation, the cool air enters as a result of low pressure occurring at the trailing side (considering disk rotation)of an air dam arranged at the disk periphery in the direction of rotation and heated air leaves on the leading side of the dam, where the pressure is elevated. By so arranging the plane of the disks as to be parallel to a heat exchange surface adapted to engage the item to be cooled a low profile forced-air cooling apparatus results which is well suited to the limited clearances typical of electronics enclosures.

In an alternative implementation incoming air is ducted through openings in the housing to the center of the disk and is driven by disk rotation outwardly between the disk and the enclosing slot wall to exit at openings in the outer wall defining the slot.

A further alternative has disks that extend over more than one device for cooling. Another alternative has plural disk center axes to allow extended areas for cooling while still achieving a low profile.

BRIEF DESCRIPTION OF THE DRAWINGS

The various aspects of the invention are set forth in the appended claims. The invention itself, as well as preferred implementations thereof, are best understood by reference to the following detailed description taken in conjunction with the accompanying drawings wherein:

DETAILED DESCRIPTION OF PREFERRED EMBODIMENTS

Figure 1:
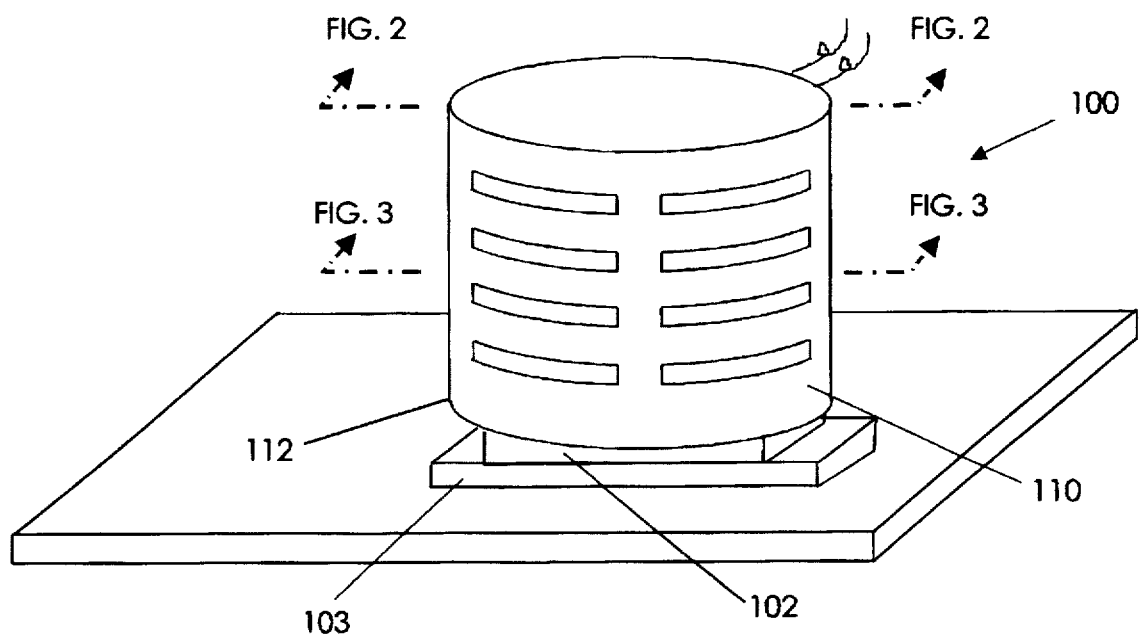
FIG. 1 is a perspective view of a cooling apparatus according to a presently preferred implementation of the invention fixed to a semiconductor chip for cooling thereof.

Referring to FIG. 1, a preferred cooling apparatus 100 according to the invention is shown mounted on a semiconductor chip 102 which is in turn mounted on a circuit board 104. The apparatus 100 is preferably mounted using a thin layer of heat conducting adhesive (not shown) so that attachment is achieved without creating a barrier to heat flow. The apparatus 100 comprises a housing 110 which is preferably molded of a heat conducting material such as aluminum and has a cylindrical shape with one end surface 112 being flat to permit intimate engagement with and bonding to the semiconductor chip 102.

Figure 2:
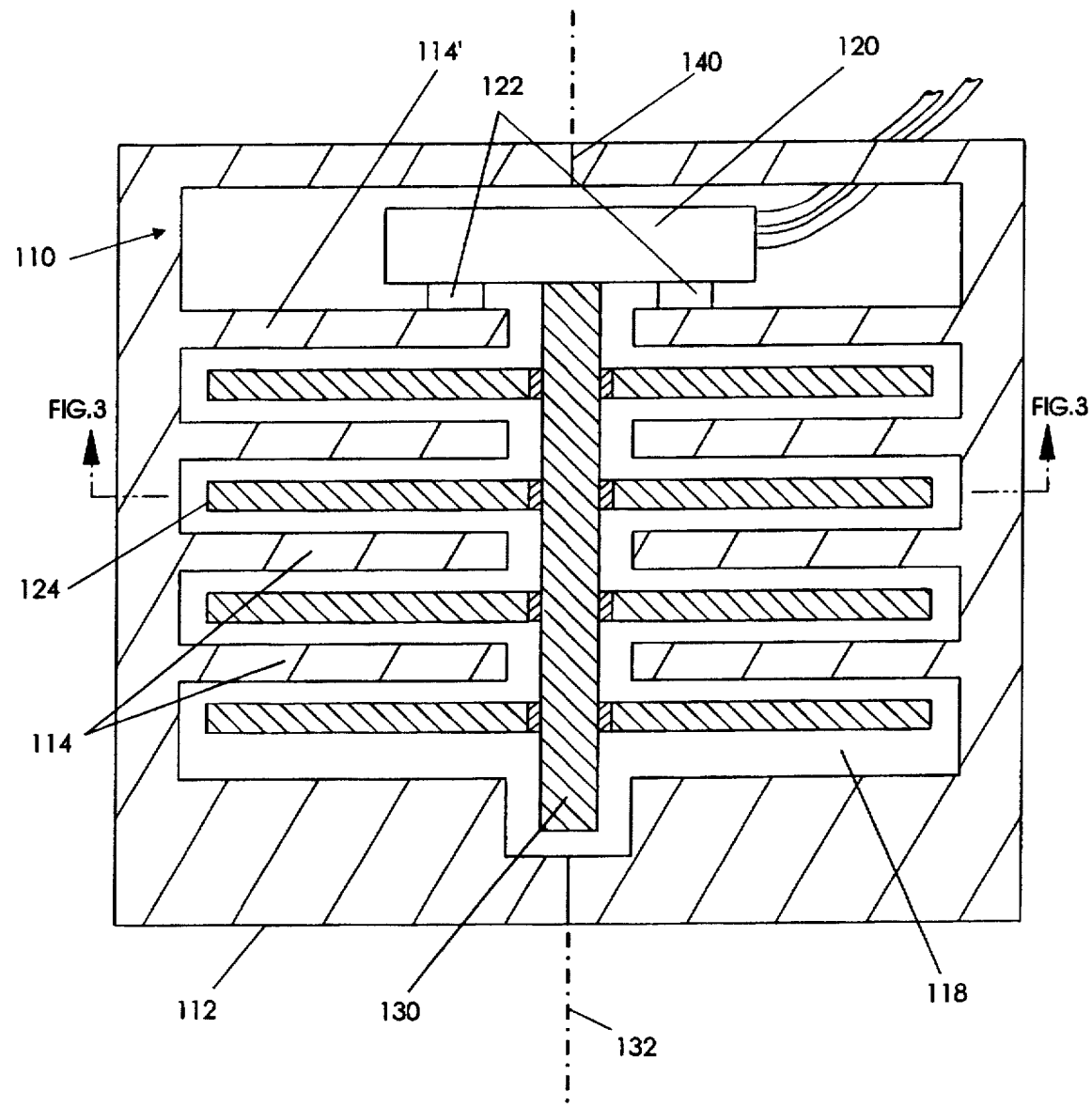
FIG. 2 is a cutaway plan view of the implementation of FIG. 1 taken longitudinally through the central axis of the cylindrical housing.

The housing 110 (see FIG. 2) has a hollowed out central chamber with spaced circular ribs 114 aligned to be parallel to the end surface 112 and extending toward but not reaching the central axis of the housing 110. The housing 110 may be formed as two half cylinders bonded along a seam 140. Such half cylinders may be molded or may be milled from solid stock as is well known.

Figure 3:
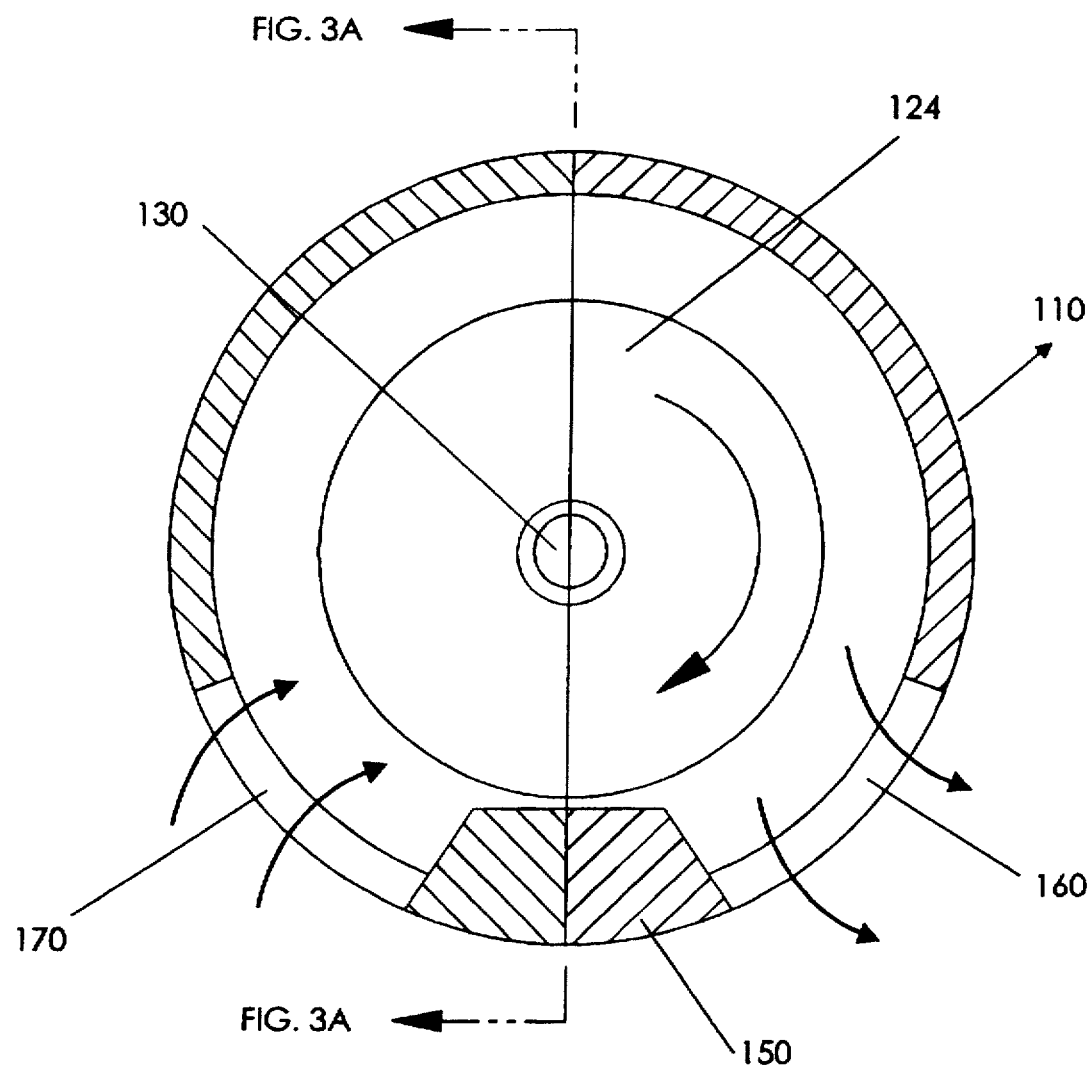
FIG. 3 is a perspective cutaway view of the implementation of FIG. 1 taken longitudinally through the central axis with a further cutaway perpendicular to the central axis through a disk receiving aperture.
Figure 3A:
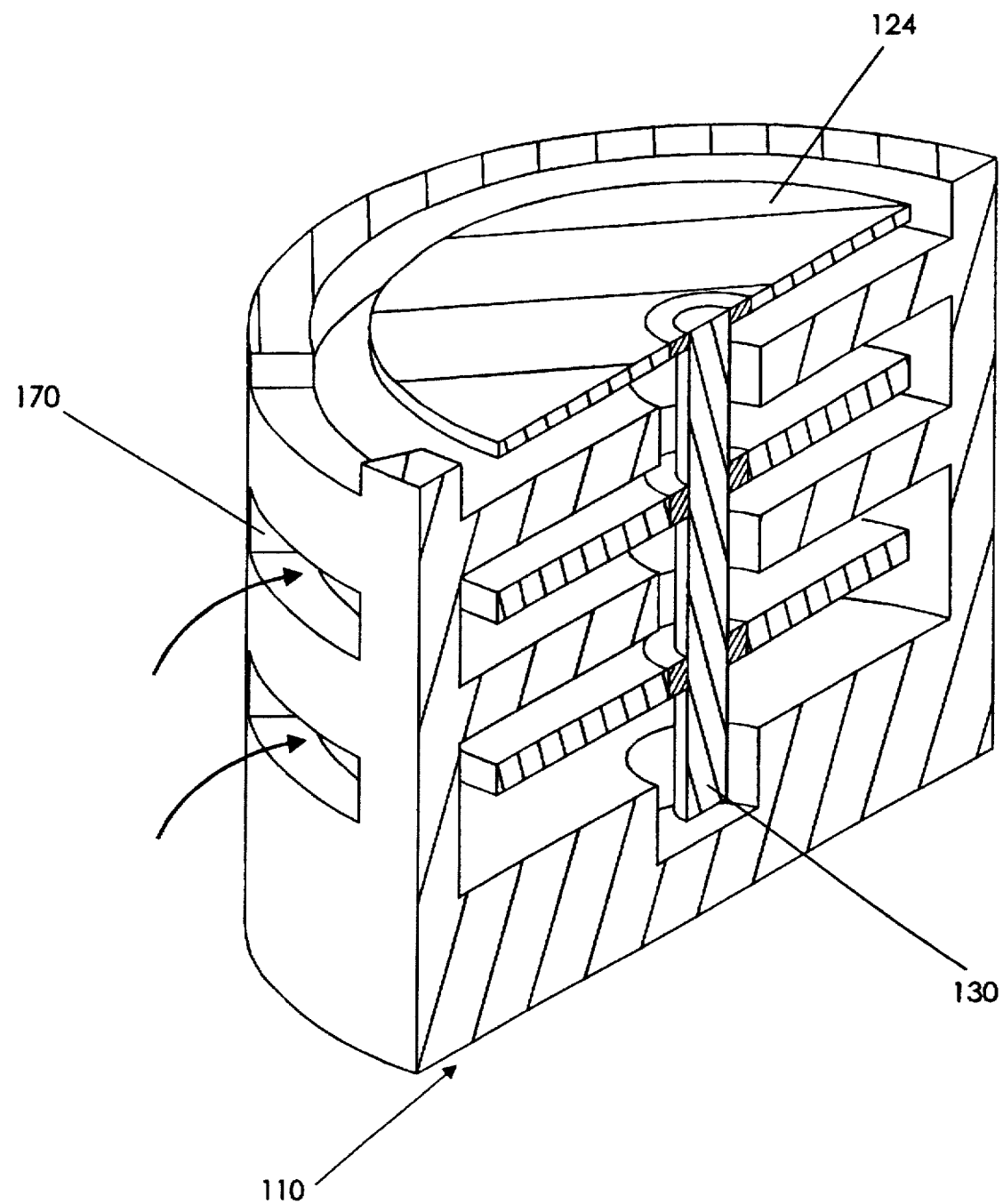

A motor 120 is mounted by adhesive mounting pads 122 to one of the ribs 114'. A shaft 130 is rotated by the motor and extends along the central axis 132 of the housing. A set of disks 124 are mounted to the shaft 122 (for example by shrink fitting) to extend perpendicularly therefrom at positions selected to align them in the spaces between circular ribs 114. As an alternative the disks 124 may be serrated (not shown) at their periphery. The ribs 114 are themselves spaced closely to define thin, generally-cylindrical disk chambers 118 in which the disks 124 rotate (see also FIGS. 3 and 3A).

Referring again to FIG. 3, in a presently preferred implementation for the invention air dams 150 are located in the walls of the housing 110 to project into the chambers which receive disks 124 and block the flow of air at the disk periphery. In conjunction with the air dams 150 perforation vents are formed in the wall of housing 110 on either side of the dam to serve as an air exhaust 160 on the forward or high pressure side (considering disk rotation) of the dam and to serve as an air intake 170 on the trailing or low pressure side of the dam.

Figure 4:
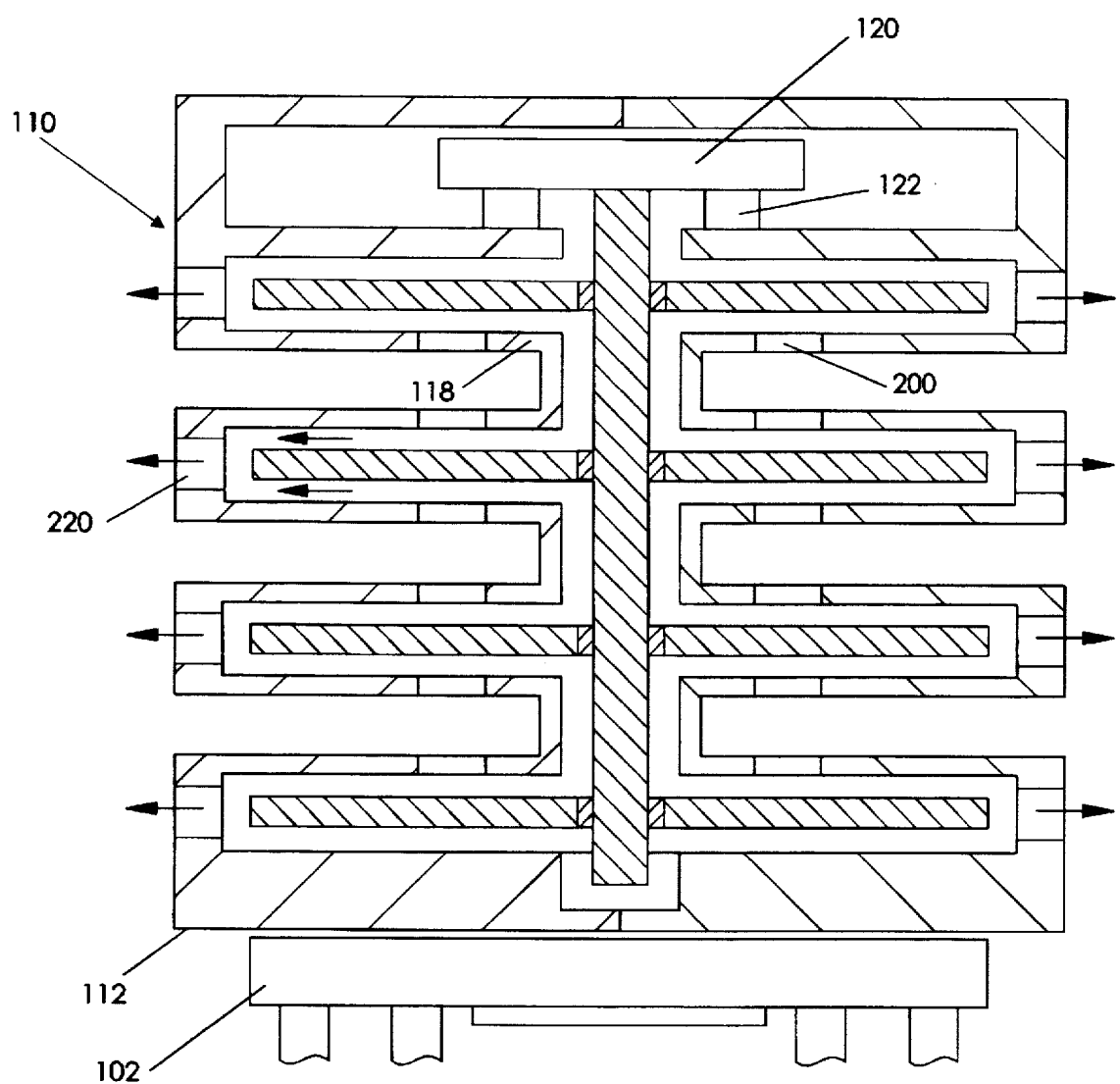
FIG. 4 is a cutaway plan view of an alternative implementation of the invention, having central air intake, taken longitudinally through the central axis of the housing.

An alternative implementation is shown in FIG. 4, which provides for intake perforations 200 to be defined in the housing 110 toward the central axis and exhaust perforations 220 to be defined at the periphery of the housing and aligned with the disk chambers 118. Preferably multiple perforations 200 and 220 are distributed uniformly around each disk chamber 118.

Figure 6:
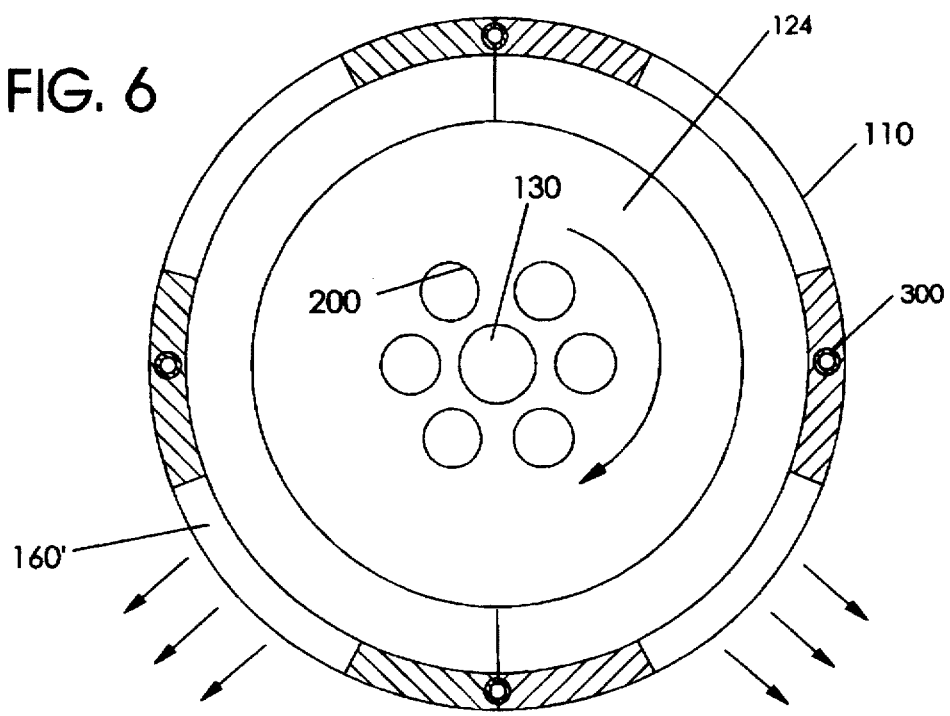
FIG. 6 is a cutaway plan view of the implementation of FIG. 5 taken perpendicular to the central axis and through a disk receiving aperature.
Figure 5:
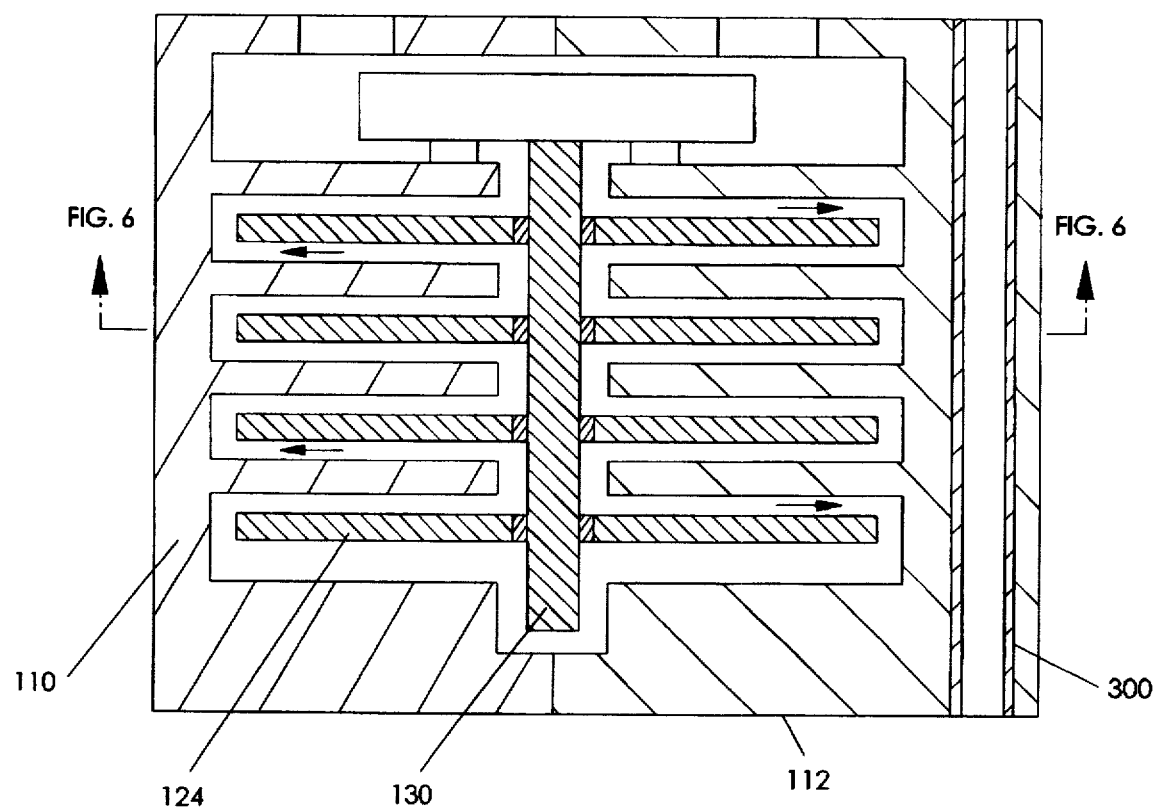
FIG. 5 is a cutaway plan view of another alternative implementation of the invention, having central air intake taken at one end of the housing, taken longitudinally through the central axis of the housing.

At FIG. 5 an implementation for the invention is shown with a heat pipe 300 mounted in the housing 110 to extend perpendicular to the surface 112. Heat pipes are known for improving overall heat conductivity and the heat pipe 300 serves to transfer heat away from the area of housing 110 near surface 112 (which is intended to be in contact with the surface to be cooled) to be nearer the ribs 114 (see also FIG. 6).

Figure 7:
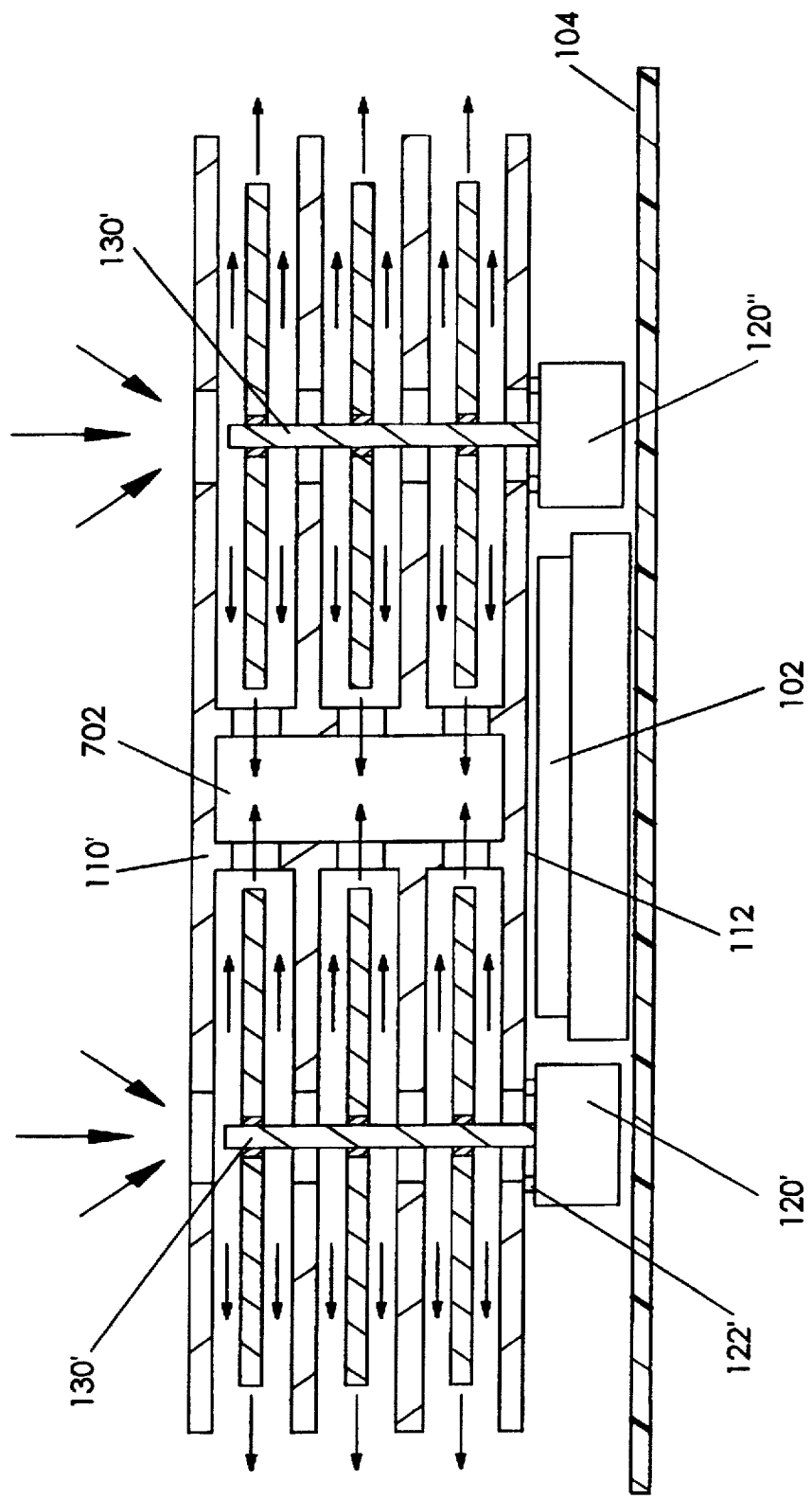
FIG. 7 is a cutaway plan view of a dual spindle implementation taken longitudinally through both spindle axes.

Referring now to FIG. 7 an alternative implementation for the inventions uses multiple motors 122' driving respective shafts 130' to drive disks 124' for moving cooling air in the housing 110'. The shafts 130' are preferably offset from the center area of the housing 110' and a channel 702 for air flow is defined adjacent to the contact area of surface 112 with the chip 102.

Figure 8:
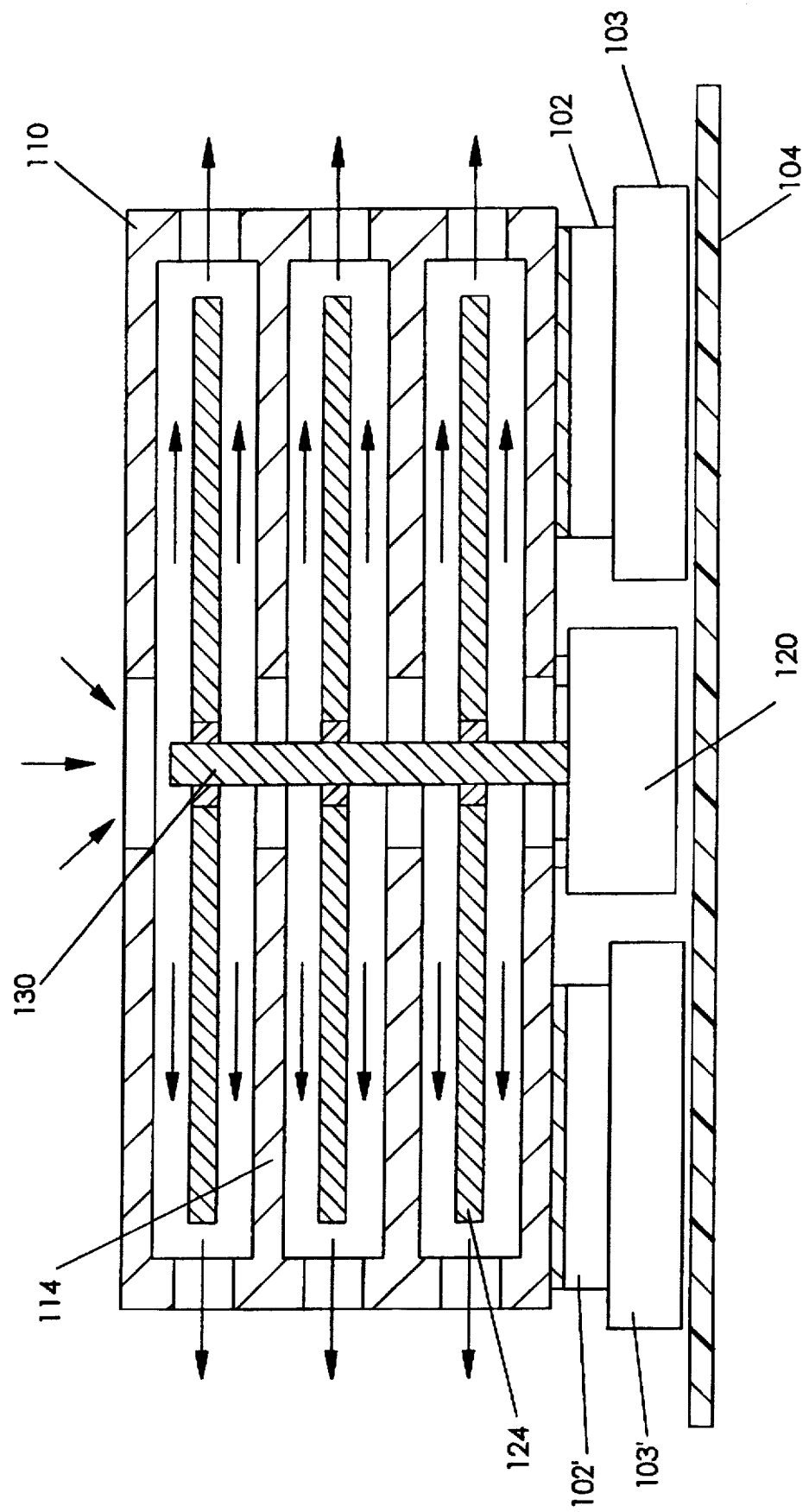
FIG. 8 is a cutaway view of an implementation, having a single spindle, taken through the longitudinal axis of the spindle, which implementation is intended to cool multiple devices.

Referring to FIG. 8 there is shown an alternative implementation using a larger housing 110 to extend over multiple semiconductor chips 102 for cooling. For this implementation the motor 120 may be arranged on the side of housing 110 toward the chips 102 and between such chips to reduce the required clearance distance from the circuit board 104 when the cooler is installed.

In describing the inventions in various aspects, reference has been made to preferred embodiments; however, it should be appreciated that variations and modifications will be suggested to those skilled in the art which are within the spirit and scope of the claimed invention.

What is claimed is:

1. A cooling apparatus for a heat-producing device with a flat surface for transferring heat comprising:

a housing including 1) a first portion having a generally flat heat-exchanging surface for engaging said flat surface of said heat-producing device and 2) one or more portions defining narrow slots substantially parallel to and aligned with said flat, heat-exchanging surface, said slot defining portions also defining multiple air-passage openings which extend from the slots externally of said housing for receiving and expelling air;

at least one disk arranged in a respective one of said slots, which disk is mounted to a shaft to rotate therewith about the disk central axis; and a motor mounted to said housing and coupled to rotate said shaft whereby cooling air is pumped through said slot(s) to remove heat applied at said surface from said housing.

2. A cooling apparatus according to claim 1 wherein said housing is formed of a heat conducting metal.

3. A cooling apparatus according to claim 1 wherein the disk(s) are serrated at the outer periphery.

4. A cooling fan apparatus according to claim 1 wherein said motor is mounted at the end of said housing opposite said flat, heat-exchanging surface.

5. A cooling fan apparatus according to claim 1 wherein said slots are defined by said housing to be essentially cylindrical and said shaft is aligned with the central axis thereof.

6. A cooling fan apparatus according to claim 5 wherein a subset of said air-passage openings are defined toward the central axis and a second subset thereof being defined in the housing at the slot circumference.

7. A cooling fan apparatus according to claim 5 wherein said air passage openings are defined at the slot circumference and intake and exhaust openings are separated by an air dam formed in the housing at the slot circumference.

8. A cooling fan apparatus comprising:

a heat conducting housing having a flat surface at one end for engaging a heat source to receive heat therefrom;

said housing having defined therein a hollow central area with a plurality of fins extending parallel to said flat surface;

a motor mounted to said housing and having a shaft extending therefrom to be generally perpendicular to said flat surface;

one or more disks mounted to rotate with said shaft and arranged between said fins so as to cause a pressure differential within said housing;

an intake aperture at a low pressure area of said housing to allow an inflow of cooling air;

an exhaust aperature at a high pressure area of said housing to allow cooling air flowing in at the intake aperture to be removed from said housing whereby cooling of said housing is effected.

9. A cooling fan apparatus according to claim 8 wherein the intake aperature is located centrally of said housing and the exhaust aperature is located at the periphery of said housing.

10. A cooling fan apparatus according to claim 8 wherein the intake aperature and the exhaust aperature are located at the periphery of said housing and they are separated by an air dam that establishes a pressure differential.

* * * * *